United States Patent [19]
Shimada et al.

[11] Patent Number: 5,726,461
[45] Date of Patent: Mar. 10, 1998

[54] ACTIVE MATRIX SUBSTRATE AND SWITCHING ELEMENT

[75] Inventors: Takayuki Shimada, Yamatokoriyama; Atsushi Ban, Soraku-gun; Kazuko Hirakawa, Tenri, all of Japan

[73] Assignee: Sharp Kabushiki Kaisha, Osaka, Japan

[21] Appl. No.: 581,965

[22] Filed: Jan. 2, 1996

[30] Foreign Application Priority Data

Jan. 31, 1995 [JP] Japan ................... 7-014733

[51] Int. Cl.$^6$ .............. H01L 29/04; H01L 33/00
[52] U.S. Cl. ................. 257/59; 257/72; 257/88; 257/91
[58] Field of Search ............. 257/746, 59, 72, 257/88, 89, 90, 91, 92, 93

[56] References Cited

U.S. PATENT DOCUMENTS

| | | | |
|---|---|---|---|
| 4,492,441 | 1/1985 | Konishi et al. | 257/59 |
| 5,166,960 | 11/1992 | Da Costa | 377/70 |
| 5,214,416 | 5/1993 | Kondo et al. | 340/740 |
| 5,237,346 | 8/1993 | Da Costa et al. | 346/155 |
| 5,311,040 | 5/1994 | Hiramatsu et al. | 257/57 |
| 5,311,041 | 5/1994 | Tominaga et al. | 257/66 |
| 5,541,749 | 7/1996 | Konuma et al. | 359/68 |

FOREIGN PATENT DOCUMENTS

| | | |
|---|---|---|
| 61-91688 | 5/1986 | Japan . |
| 2-47633 | 2/1990 | Japan . |
| 2-275620 | 11/1990 | Japan . |

Primary Examiner—Carl W. Whitehead
Attorney, Agent, or Firm—Nixon & Vanderhye P.C.

[57] ABSTRACT

An active matrix substrate comprises an insulation substrate, a plurality of pixel electrodes arranged in a matrix form on the insulation substrate, a switching element provided for each of the pixel electrodes, gate signal lines for supplying a signal to the switching elements, and source signal lines for supplying a data signal to the pixel electrodes via the corresponding switching elements. Each switching element is a thin film transistor (TFT) including a gate electrode, an insulating layer formed on the insulation substrate to cover the gate electrode, a semiconductor layer formed on the insulating layer opposite to the gate electrode, a source electrode formed on one end of the semiconductor layer, one of the source signal lines overlapping the source electrode, and a drain electrode formed on the other end of the semiconductor layer, one of the gate signal lines overlapping the drain electrode. The source and drain electrodes have a two-layer structure of an upper amorphous semiconductor layer and a lower micro-crystalline semiconductor layer. The source signal lines have a two-layer structure of an upper conductive layer and a lower protection layer.

20 Claims, 10 Drawing Sheets

PRIOR ART

FIG. 3A

PRIOR ART

FIG. 3B

PRIOR ART

FIG. 3C

PRIOR ART

ACTIVE MATRIX SUBSTRATE AND SWITCHING ELEMENT

BACKGROUND OF THE INVENTION

1. Field of the Invention

The present invention relates to an active matrix substrate and a switching element provided thereon. More particularly, the invention relates to a structure of a thin film transistor provided as a switching element for an active matrix substrate and an active matrix substrate having an improved source line structure.

2. Description of the Related Art

Figure 1:
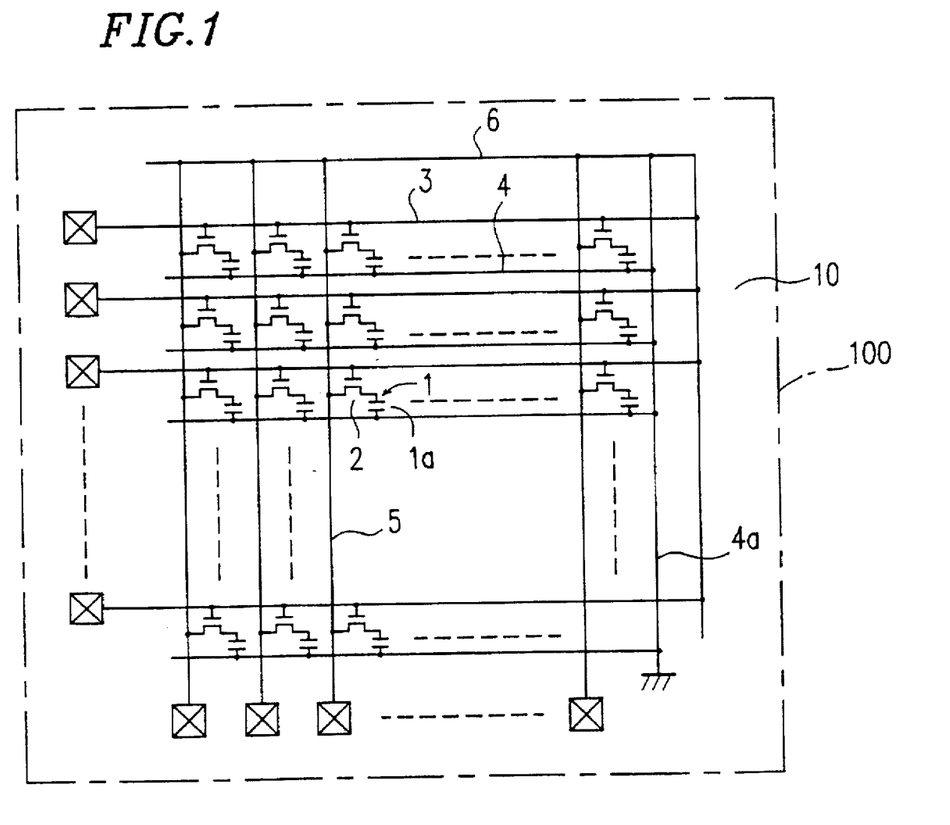
FIG. 1 is a schematic view of an overall structure of a conventional active matrix substrate.

FIG. 1 schematically shows a structure of a conventional active matrix substrate 100 in which pixel electrodes 1 are arranged to form a matrix on an insulation substrate 10. A thin film transistor (TFT) 2 serving as a switching element and a pixel capacitance 1a are provided for each pixel electrode 1.

In the active matrix substrate 100, a gate signal line 3 is disposed along each row of the matrix of the TFTs 2 on the insulation substrate 10, and is connected to gate electrodes of the corresponding TFTs 2. The TFTs 2 are controlled to turn on (electrically conductive state) and turn off (electrically non-conductive state) by a signal supplied to the gate electrodes thereof from the gate signal line 3. As a result, the corresponding pixel electrodes 1 are driven. A source signal line 5 is disposed along each column of the matrix of the TFTs 2 on the insulation substrate 10, and is connected to source electrodes of the corresponding TFTs 2. A video signal from an external source (not shown) is supplied to the source electrodes of the TFTs 2 via the source signal line 5.

As shown in FIG. 1, one terminal of the pixel capacitance 1a is connected to a drain electrode of the corresponding TFT 2. The other terminal of the pixel capacitance 1a is connected to a pixel capacitance line 4 which is disposed parallel to each gate signal line 3. The pixel capacitance line 4 is connected to a counter electrode (not shown) formed on a counter substrate (not shown) when the active matrix substrate 100 is combined with the counter substrate to form a liquid crystal panel. In the liquid crystal panel, a liquid crystal material is interposed between the substrates and a liquid crystal cell is formed corresponding to each pixel electrode 1.

Wiring 6 shown in FIG. 1 is provided in order to prevent the TFTs 2 from electrostatic breakdown in the fabrication process of the active matrix substrate 100. The wiring 6 is coupled to the gate signal lines 3, the source signal lines 5, and wiring 4a which is connected to each pixel capacitance line 4. The wiring 6 is electrically disconnected so that the gate signal lines 3, the source signal lines 5, and the wiring 4a are insulated from each other when the fabrication of the active matrix substrate 100 is completed.

Figure 2:
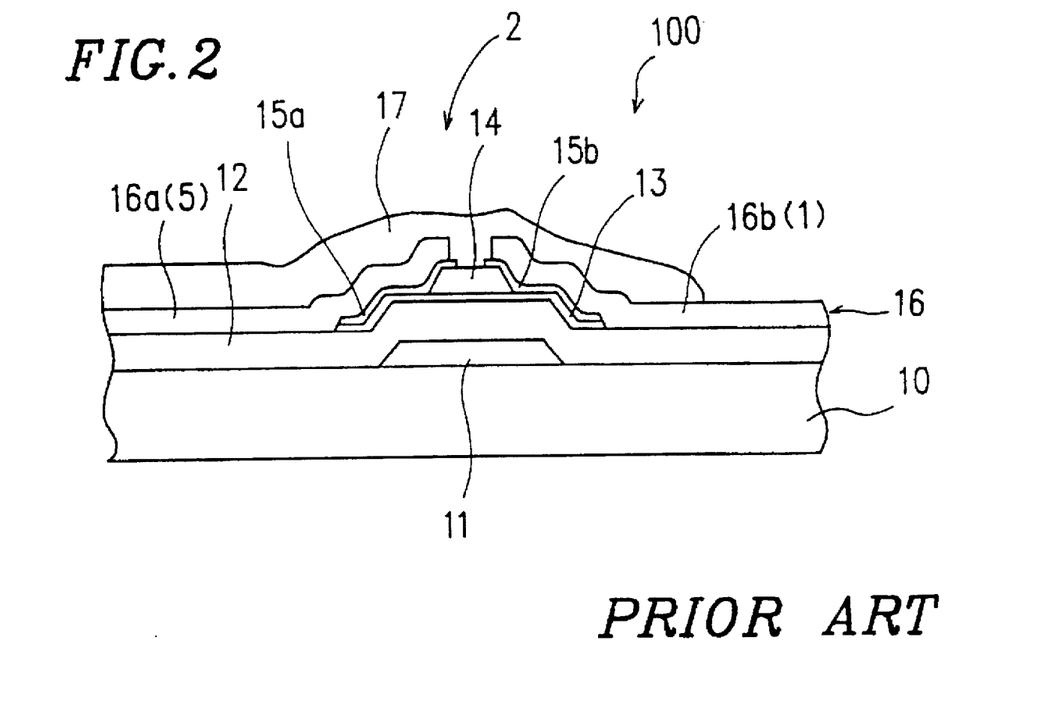
FIG. 2 is a cross-sectional view of a TFT portion of the conventional active matrix substrate.

FIG. 2 shows a cross-sectional structure of a portion of the active matrix substrate 100 in which the TFT 2 is formed. The TFT 2 has a reverse stagger type structure. As shown in FIG. 2, the TFT 2 includes a gate electrode 11 formed on the insulation substrate 10, a gate insulating layer 12 covering the gate electrode 11, a semiconductor layer 13 formed on the gate insulating layer 12 opposite the gate electrode 11, a source electrode 15a formed on one end of the semiconductor layer 13, and a drain electrode 15b formed on the other end of the semiconductor layer 13.

The semiconductor layer 13 is made of amorphous silicon or polycrystalline silicon. The source and drain electrodes 15a and 15b are made of micro-crystalline n-type ($n^+$) silicon. A channel protection layer 14 is formed on a central portion of the semiconductor layer 13 in order to protect a channel region of the TFT 2 exposed between the source electrode 15a and the drain electrode 15b.

A transparent conductive layer (ITO thin film) 16 is formed on the gate insulating layer 12, the source electrode 15a, and the drain electrode 15b. As shown in FIG. 2, the transparent conductive layer 16 includes portions 16a and 16b. The pixel electrode 1 and the source signal line 5 are patterned from the transparent conductive layer 16, the portion 16a forming the source signal line 5 and the portion 16b forming the pixel electrode 1. In addition, an insulating layer 17 as a protection film covers a portion of the insulation substrate 10 in which the TFT 2 is formed.

As described above, by patterning the source signal line 5 and the pixel electrode 1 from the same layer, the process for forming devices on the active matrix substrate 100 is simplified, resulting in a reduction in the fabrication cost of the active matrix substrate 100. In addition, forming the source electrode 15a and the drain electrode 15b of the TFT 2 from micro-crystalline $n^+$ silicon layer increases the mobility of electrons in the source and drain electrodes 15a and 15b, whereby an ON-current of the TFT 2 is increased.

However, when the source and drain electrodes 15a and 15b of the TFT 2 are made of micro-crystalline $n^+$ silicon, as is in the case of the active matrix substrate 100, the transparent conductive layer 16 forming the source signal line 5 and pixel electrode 1 is likely to break where they cover a step portion of the micro-crystalline $n^+$ silicon layer, resulting in a pixel defect. The reason why the break is likely to occur in the transparent conductive layer 16 in the step porion will be described bellow.

When the $n^+$ silicon layer is deposited under the conditions of forming amorphous silicon, there is no crystalline structure formed in the $n^+$silicon layer, so that the $n^+$ silicon layer is formed in a thin film having a flat surface, as is the case of a silicon oxide layer or silicon nitride layer formed by using a CVD method.

On the other hand, when the $n^+$ silicon layer is deposited under the conditions of forming micro-crystalline silicon, the $n^+$ silicon layer is formed as an aggregation of micro crystals, so that a surface of the $n^+$ silicon layer has concave and convex portions according to the micro-crystalline structure.

As shown in FIG. 2, the portions 16a and 16b which are patterned from the same ITO thin film 16 are disposed on the source electrode 15a and drain electrode 16b made of micro-crystalline $n^+$ silicon, respectively. The ITO thin film 16 has different characteristics according to the difference in surface shape of the underlying layer.

For example, in the case where the ITO thin film 16 is formed on an amorphous $n^+$ silicon layer which has a flat surface, relatively large grains grow in the ITO thin film 16, as is in the case where the ITO thin film 16 is formed on a silicon oxide or silicon nitride film which are formed by a CVD method. On the other hand, in the case where the ITO thin film 16 is formed on a micro-crystalline $n^+$ silicon layer which has concave and convex portions on a surface thereof, grains of the ITO thin film 16 grow in accordance with the concave and convex portions of the surface of the underlying layer. Thus, the grains of the ITO thin film 16 on the micro-crystalline silicon are smaller than those of the ITO thin film 16 which is formed on the amorphous $n^+$ silicon.

The difference in the grain size is apparent from the difference in the characteristics of the ITO thin film 16. For example, an etch rate using ferric trichloride solution at a temperature of 40° C. is about 80Å/sec for the ITO thin film formed on the amorphous n⁺ silicon layer, while the etch rate is about 110Å/sec for the ITO thin film formed on the micro-crystalline n⁺ silicon layer. This indicates that the ITO thin film formed on the micro-crystalline n⁺ silicon layer, which has a smaller grain size, is not so dense as compared with that formed on the amorphous n⁺ silicon.

Furthermore, in general, in thin film devices which are formed by laminating thin films, an upper thin film is easily weakened in a step portion on a edge of the underlying thin film, so that the step portion is subject to be etched abnormally to cause a break defect in the upper thin film.

Accordingly, in the case where the micro-crystalline n⁺ silicon layer is used for the source and drain electrodes 15a and 15b of the TFT 2 shown in FIG. 2, the ITO thin film 16 (the portion 16a for the source signal line 5 and the portion 16b for the pixel electrode 1) formed on the source and drain electrodes 15a and 15b has a higher etch rate, so that the ITO thin film 16 is subject to over-etching and is likely to break in a step portion in particular, resulting in a break defect. In general, such a break defect in a conductive thin film usually causes a problem in a switching element.

A breakage of a conductive layer formed on the active matrix substrate 100 occurs not only in the TFT 2 (switching element portion) but also occurs in the source signal line 5 in a portion crossing over the gate signal line 3, resulting in a break defect of the device. For example, dust or other foreign particles are subject to being stuck to a edge portion of the gate signal line 3 during the fabrication process, which easily causes abnormal etching of thin film layers formed thereon. When the ITO thin film 16 is formed on the gate signal line 3 with the gate insulating layer 12 interposed therebetween, such dust or other foreign particulate stuck to the edge portion of the gate signal line 3 causes abnormal etching in a patterning of the source signal line 5 from the ITO thin film 16, resulting in a break defect of the source signal line 5.

Figure 3A:
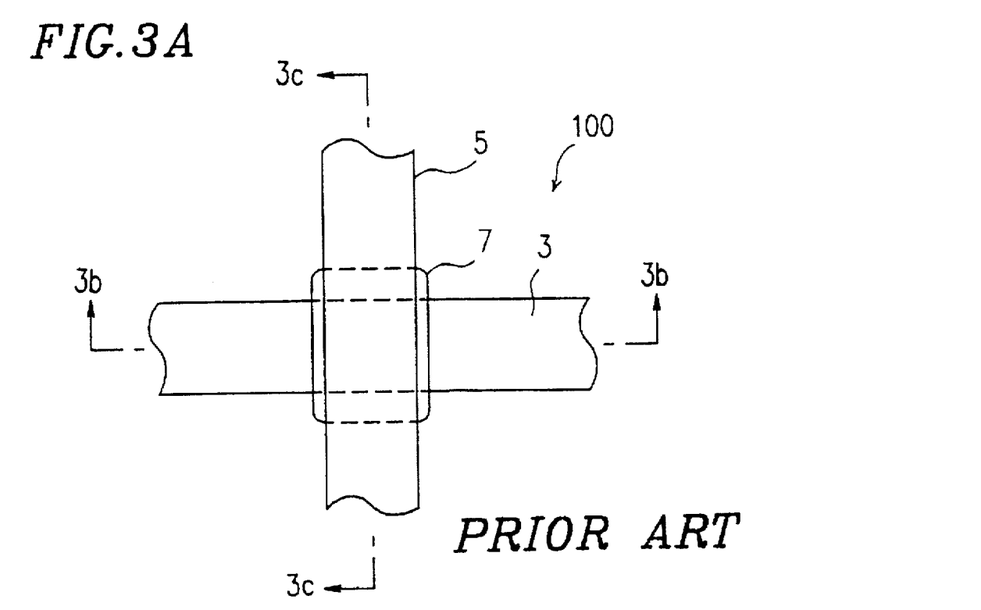
FIG. 3A is a plan view of a crossing of a gate signal line and a source signal line of the conventional active matrix substrate.
Figure 3B:
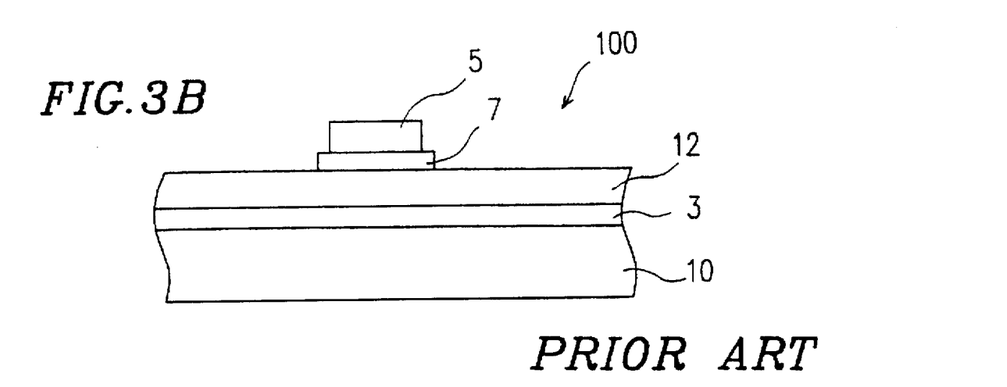
FIG. 3B is a cross-sectional view taken along line 3b—3b in FIG. 3A.
Figure 3C:
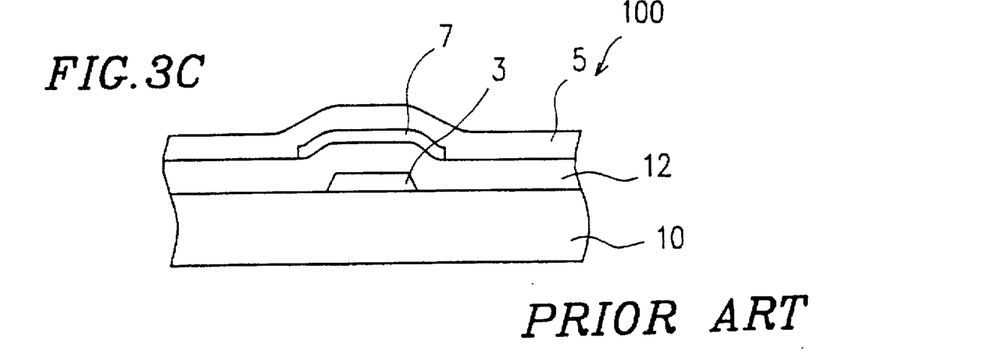
FIG. 3C is a cross-sectional view taken along line 3c—3c in FIG. 3A.

FIGS. 3A to 3C show an example of a method for preventing a break defect of the source signal line 5 in a crossing over the gate signal line 3. As shown in FIG. 3A, a conductive layer 7 is provided between the gate signal line 3 and the source signal line 5 at the crossing thereof, whereby the conductive layer 7 covers a step due to a edge of the gate signal line 3. The conductive layer 7 is formed in the same process step of patterning the source and drain electrodes 15a and 15b of the TFT 2 in order to simplify the fabrication process. Therefore, n⁺ silicon layer is used for the conductive layer 7.

FIG. 3B shows a cross sectional structure of the active matrix substrate 100 along a line 3b—3b in FIG. 3A. FIG. 3C shows a cross sectional structure along a line 3c—3c in FIG. 3A. In this structure, even if dust or other foreign particulate is stuck to a edge of the gate signal line 3, a break defect of the source signal line 5 can be prevented by covering the edge of the gate signal line 3 with the n⁺ silicon layer 7.

As described above, when micro-crystalline n⁺ silicon is used for the n⁺ silicon layer in order to increase an ON-current of the TFT 2, the conductive layer 7 covering the gate signal line 3 is also made of the n⁺ silicon layer. However, as described above, the underlying micro-crystalline layer degrades characteristics of the ITO thin film of the source signal line 5 formed thereon. Accordingly, the conductive layer 7 made of micro-crystalline n⁺ silicon introduces another problem of break defects of the source signal line 5 due to the deterioration of the ITO thin film at a crossing of the source signal line 5 over the gate signal line 3.

SUMMARY OF THE INVENTION

The active matrix substrate of this invention comprising: an insulation substrate; a plurality of pixel electrodes arranged in a matrix form on the insulation substrate; a switching element provided for each of the pixel electrodes; gate signal lines for supplying to the switching elements a signal for controlling an electrically conducting state and a non-conducting state of the switching elements; and source signal lines for supplying a data signal to the pixel electrodes via the corresponding switching elements. Each switching element is a thin film transistor (TFT) and includes: a gate electrode formed on the insulation substrate; an insulating layer formed on the insulation substrate so as to cover the gate electrode; a semiconductor layer formed on the insulating layer in a portion opposite to one of the gate electrodes, the semiconductor layer including a channel region; a source electrode formed on one end of the semiconductor layer, one of the source signal lines overlapping the source electrode; and a drain electrode formed on the other end of the semiconductor layer, one of the pixel electrodes overlapping the drain electrode. The source and drain electrodes have a two-layer structure of an upper amorphous semiconductor layer and a lower micro-crystalline semiconductor layer.

In one embodiment of the present invention, the source and drain electrodes are made of an n-type silicon and have a two-layer structure of an upper amorphous n-type silicon layer and a lower micro-crystalline n-type silicon layer.

In one embodiment of the present invention, the TFT is of a channel etch type.

In another embodiment of the present invention, the TFT further includes a second insulating layer formed on the channel region of the semiconductor layer so as to protect the channel region, the TFT being of a reverse stagger type.

In still another embodiment of the present invention, each of the source signal lines has a two-layer structure of an upper conductive layer and a lower protection layer made of an insulator.

In still another embodiment of the present invention, each of the source signal lines has a two-layer structure of an upper conductive layer and a lower protection layer which is patterned from a same insulating layer as the second insulating layer.

In still another embodiment of the present invention, each of the source signal lines has a two-layer structure of an upper conductive layer and a lower protection layer made of a semiconductor.

The lower protection layer is preferably patterned from a same semiconductor layer as the semiconductor layer formed on the insulating layer on the gate electrode.

The lower protection layer may be an amorphous semiconductor layer.

The lower protection layer may have a two-layer structure of an upper micro-crystalline semiconductor layer and a lower amorphous semiconductor layer.

The lower protection layer may have a three-layer structure of an upper amorphous semiconductor layer, a middle micro-crystalline semiconductor layer, and a lower amorphous semiconductor layer.

In one embodiment of the present invention, the lower amorphous semiconductor layer of the lower protection layer is preferably patterned from a same amorphous semiconductor layer as the semiconductor layer formed on the insulating layer on the gate electrode, and the upper micro-crystalline semiconductor layer of the lower protection layer is preferably patterned from a same micro-crystalline semiconductor layer as the lower micro-crystalline layer of the source and drain electrodes.

In another embodiment of the present invention, the lower amorphous semiconductor layer of the lower protection layer is patterned from a same layer as the semiconductor layer formed on the insulating layer on the gate electrode, the middle micro-crystalline semiconductor layer of the lower protection layer is patterned from a same micro-crystalline semiconductor layer as the lower micro-crystalline layer of the source and drain electrodes, and the upper amorphous semiconductor layer of the lower protection layer is patterned from a same amorphous semiconductor layer as the upper amorphous semiconductor layer of the source and drain electrodes.

The source signal lines and the pixel electrodes are preferably patterned from a same conductive thin film.

In still another embodiment of the present invention, each of the source signal lines has an upper conductive layer and a lower protection layer which is provided at crossings of the source signal lines over the gate signal lines.

The lower protection layer may be made of amorphous semiconductor.

The lower protection layer may have a two-layer structure of an upper micro-crystalline semiconductor layer and a lower amorphous semiconductor layer.

The lower protection layer may have a three-layer structure of an upper amorphous semiconductor layer, a middle micro-crystalline semiconductor layer, and a lower amorphous semiconductor layer.

A thin film transistor (TFT) of the present invention is used as a switching element for an active matrix substrate. The TFT comprises: a gate electrode formed on an insulation substrate; an insulating layer formed on the gate electrode; a semiconductor layer formed on the insulating layer including a channel region; a source electrode formed on one end of the semiconductor layer, a first conductive layer overlapping the source electrode; and a drain electrode formed on the other end of the semiconductor layer, a second conductive layer overlapping the drain electrode. The source and drain electrodes have a two-layer structure of an upper amorphous semiconductor layer and a lower micro-crystalline semiconductor layer.

In one embodiment of the present invention, the source and drain electrodes are made of an n-type silicon and have a two-layer structure of an upper amorphous n-type silicon layer and a lower micro-crystalline n-type silicon layer.

Thus, the invention described herein makes possible the advantages of (1) providing an active matrix substrate in which an ON-current of a switching element (TFT) is increased by improving a crystalline structure of a conductive layer forming source and drain electrodes of the TFT, and in which a transparent thin film which is formed on the conductive layer in a switching element portion thereof is prevented from a break defect due to the crystalline structure of the conductive layer, and (2) providing an active matrix substrate in which a source signal line is prevented from a break defect due to an edge portion of a gate signal line over which the source signal line crosses, without degrading the characteristics of an ITO film forming the source signal line.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 4:
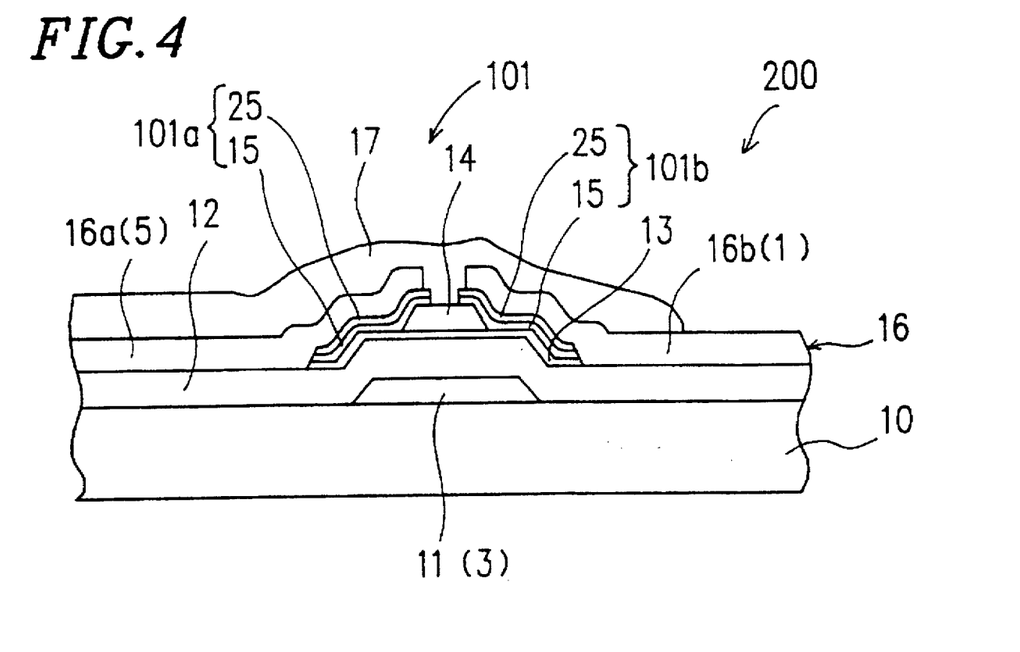
FIG. 4 is a cross-sectional view of a TFT portion of an active matrix substrate according to one embodiment of the present invention.

FIG. 4 shows a cross-sectional structure of a portion of an active matrix substrate 200 of the present invention, in which a switching element 101 is formed. An overall structure of the active matrix substrate 200 is the same as that of the active matrix substrate 100 shown in FIG. 1.

As shown in FIG. 4, the switching element 101 of the active matrix substrate 200 is a TFT of a reverse stagger type. As shown in FIG. 4, the TFT 101 includes a gate electrode 11 formed on the insulation substrate 10, a gate insulating layer 12 covering the gate electrode 11, a semiconductor layer 13 formed on the gate insulating layer 12 opposite the gate electrode 11, a source electrode 101a formed on one end of the semiconductor layer 13, and a drain electrode 101b formed on the other end of the semiconductor layer 13.

The semiconductor layer 13 is made of amorphous silicon or polycrystalline silicon. Each of the source electrode 101a and the drain electrode 101b includes a lower layer 15 made of micro-crystalline n$^+$ silicon and an upper layer 25 made of amorphous silicon, so as to have a two-layer structure. A channel protection layer 14 is formed on a central portion of the semiconductor layer 13, in order to protect a channel region of the TFT 101 which is exposed between the source electrode 101a and the drain electrode 101b.

A transparent conductive layer (ITO thin film) 16 is formed on the gate insulating layer 12, the source electrode 101a, and the drain electrode 101b. As shown in FIG. 4, the transparent conductive layer 16 includes portions 16a and 16b. As is in the case of the active matrix substrate 100 shown in FIG. 1, the pixel electrode 1 and the source signal line 5 (denoted in parentheses) are patterned from the transparent conductive layer 16, the portion 16a forming the source signal line 5 and the portion 16b forming the pixel electrode 1. In addition, an insulating layer 17 as a protection film covers a portion of the insulation substrate 10 in which the TFT 101 is formed.

Next, a method for manufacturing the active matrix substrate 200 will be described.

A gate electrode 11 and a gate signal line 3 are formed on an insulation substrate 10 such as a glass substrate or quartz substrate, by patterning a conductive layer of Ta or the like. Then, a silicon oxide film is formed on an entire surface of the insulation substrate 10 by using a CVD method, whereby a gate insulating layer 12 is formed. A semiconductor layer 13 is formed by patterning an amorphous silicon layer which is deposited on the gate insulating layer 12 using a CVD method so as to have a thickness of about 50 nm. The semiconductor layer 13 includes a channel region of the TFT 101. A channel protection layer 14 is formed on a central portion of the gate electrode 11 by patterning a silicon nitride layer which is deposited on the semiconductor layer 13 by a CVD method.

Next, a source electrode 101a and a drain electrode 101b are formed by using a two-step CVD method as described below.

First, a n$^+$ silicon layer 15 is formed so as to have a thickness of 30 nm under conditions for making a micro-crystalline structure thereof. The micro-crystalline n$^+$ silicon layer 15 can be formed, for example, by using the method disclosed in Japanese Laid-Open Patent Publication No. 2-275620. Such method is as follows:

Silane (SiH$_4$) gas, silane halide gases, or a mixture of two or more kinds of these gases is diluted with a rare gas such as argon gas or hydrogen gas by a ratio greater than 1:1. The diluted gas is mixed with a dopant gas to form a gas mixture. A substrate made of glass or the like is put in the gas mixture, and the gas mixture is converted into a plasma state by applying thereto electric power having a plasma discharge power density greater than about 0.2 W/cm$^2$, so that a silicon thin film is formed on the substrate.

By using this method, impurity atoms of the dopant are combined into silicon network with a coordination number of 4, and minute crystal portions are formed to disperse in an amorphous layer of the silicon thin film. Thereby, a micro-crystalline structure is formed. A silicon thin film having such a micro-crystalline structure exhibits, advantageously, a large optical band gap as amorphous silicon and high conductivity as polycrystalline silicon.

Next, an n$^+$ silicon layer 25 is formed on the micro-crystalline silicon layer 15 under such conditions as to be an amorphous silicon layer having a thickness of 20 nm. Then, the micro-crystalline n$^+$ silicon layer 15 and the amorphous n$^+$ silicon layer 25 are patterned to form the source electrode 101a and the drain electrode 101b each having the two-layer structure. Thus the fabrication of the TFT 101 is completed.

An n$^+$ silicon layer having a thickness of 50 nm and the above-described two-layer structure of a lower micro-crystalline layer and an upper amorphous layer has an upper surface flatter than that of a single micro-crystalline n$^+$ silicon layer having a thickness of 50 nm. The reason why is as follows: while the single micro-crystalline layer has concave and convex portions on the surface thereof in accordance with a grain structure of the micro-crystals formed therein, in the two-layered n$^+$ silicon layer, the concave and convex portions of the surface of the lower micro-crystalline n$^+$ silicon layer are filled in and leveled by the upper amorphous n$^+$ layer formed thereon. Consequently, the upper surface is flattened to some extent.

Next, a transparent conductive layer 16, for example, an ITO thin film is formed on the entire surface of the active matrix substrate 200 by sputtering. Then, the transparent conductive layer 16 is patterned to form a portion 16a for a source signal line 5 and a portion 16b for a pixel electrode 1. As shown in FIG. 4, the portion 16a (source signal line 5) overlaps the source electrode 101a, and the portion 16b (pixel electrode 1) overlaps the drain electrode 101b. Then, an insulating layer 17 is formed to cover the TFT 101 as a protection layer by using a CVD method.

According to this embodiment, the n$^+$ silicon layer forming the source and drain electrodes 101a and 101b which are disposed under the transparent conductive layer (ITO thin film) 16 has a relatively flat surface because of the two-layer structure of the upper amorphous layer 25 and the lower micro-crystalline layer 15. Therefore, large grains can grow in the transparent conductive layer 16 formed on the source and drain electrodes 101a and 101b, without being affected by the concave-convex surface of the lower micro-crystalline layer 15, so as to allow the characteristics (crystalline structure) of the ITO thin film to be satisfactory. This makes it possible to prevent a break defect from occurring in the source signal line 5 and pixel electrode 1 formed on the source and drain electrodes 101a and 101b of the TFT 101, resulting in an increase of the fabrication yield.

Furthermore, the source and drain electrodes 101a and 101b have an electron mobility greater than that of source and drain electrodes of a single-layered amorphous silicon layer because of the micro-crystalline n$^+$ silicon layer 15 included therein. Thus, an ON-current of the TFT 101 can be increased, in addition to prevention of the break defect in the ITO film due to the above-mentioned deterioration of the characteristics.

EXAMPLE 2

Figure 5A:
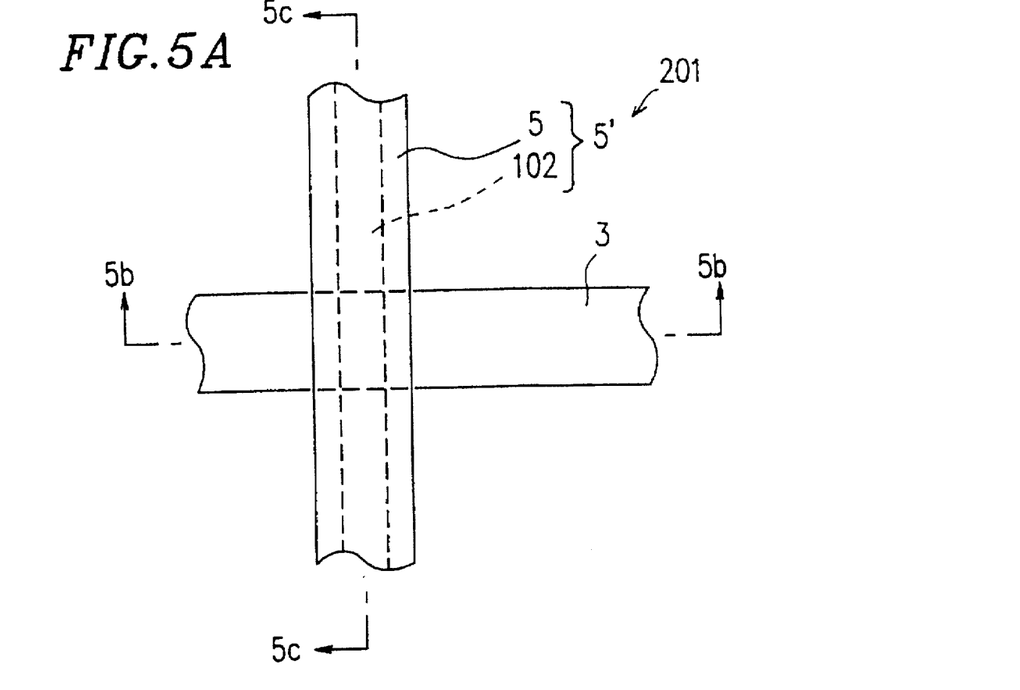
FIG. 5A is a plan view of a crossing of a gate signal line and a source signal line of an active matrix substrate according to another embodiment of the present invention.
Figure 5B:
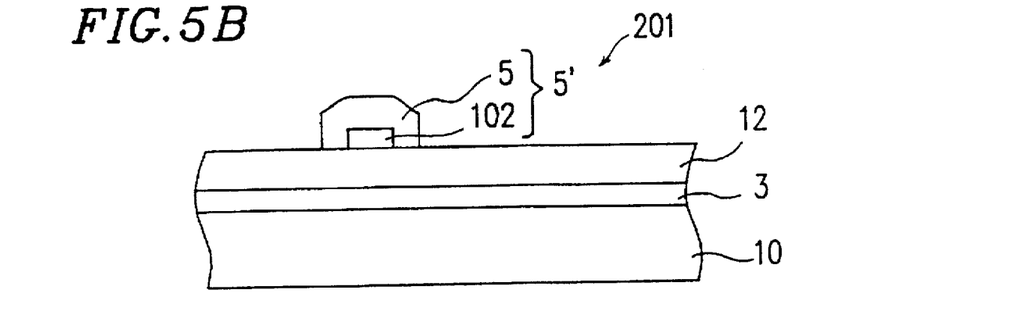
FIG. 5B is a cross-sectional view taken along line 5b—5b in FIG. 5A.
Figure 5C:
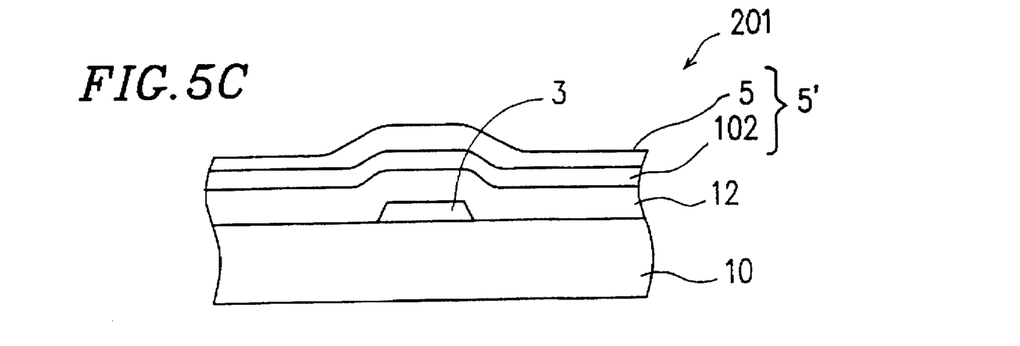
FIG. 5C is a cross-sectional view taken along line 5c—5c in FIG. 5A.

FIGS. 5A to 5C show a structure of an active matrix substrate 201 according to a second embodiment of the present invention. The overall structure of the active matrix substrate 201 and the structure of a switching element (TFT) portion thereof are the same as those of the active matrix substrate 200 of Example 1, as shown in FIGS. 1 and 4. FIG. 5A shows a crossing of a gate signal line 3 and a source signal line 5 on the active matrix substrate 201. FIGS. 5B and 5C are cross-sectional views taken along lines 5b—5b and 5c—5c in FIG. 5A, respectively.

As shown in FIGS. 5A to 5C, a wiring protection layer 102 is formed on the gate insulating layer 12 under the source signal line 5 in the active matrix substrate 201. In this example, a source signal line 5' is defined to include the source signal line 5 and the wiring protection layer 102. The wiring protection layer 102 and the channel protection layer 14 of TFT 101 (shown in FIG. 4) are patterned from a silicon nitride film having a thickness of 200 nm formed by a plasma CVD method.

In FIGS. 5A to 5C, the wiring protection layer 102 is illustrated to have a width narrower than that of the source signal line 5. Nevertheless, the width of the wiring protection layer 102 may be equal to or wider than that of the source signal line 5.

In the active matrix substrate 201 of this example, the $n^+$ silicon layer forming the source and drain electrodes 101a and 101b (shown in FIG. 4) which are disposed under the transparent conductive layer (ITO thin film) 16 has a two-layer structure of the upper amorphous layer 25 and the lower micro-crystalline layer 15. Furthermore, the source signal line 5' has a two-layer structure of the wiring protection layer 102 and the source signal line 5.

Accordingly, as shown in FIGS. 5B and 5C, the gate insulating layer 12 and the wiring protection layer 102 are interposed between the source signal line 5 and the gate signal line 3 at a crossing thereof. At the crossing, the gate insulating layer 12 is covered with the wiring protection layer 102. Thus, even if coverage of the gate insulating layer 12 is degraded at a step of an edge of the gate signal line 3 due to dust or foreign particulate stuck to the edge, a break defect is prevented from occurring in the source signal 5 by covering the degraded coverage of the gate insulating layer 12 with the wiring protection layer 102.

In addition, the wiring protection layer 102 is patterned in the same step as patterning the channel protection layer 14 from a silicon nitride film. The silicon nitride film is formed in an amorphous state by using a plasma CVD method and has a flat surface. Accordingly, sufficiently large grains grow in the ITO thin film of the source signal line 5 which is formed on the wiring protection layer 102, so that the ITO thin film is densely formed without causing a deterioration in the characteristics.

As described above, in the active matrix substrate 201 according to this example, a break defect is prevented from occurring in the source signal line 5 and the pixel electrode 1 which are formed on the source electrode 101a and the drain electrode 101b of the TFT 101, and from occurring at a crossing of the gate signal line 3 and the source signal line 5. This results in a further increase of the fabrication yield.

EXAMPLE 3

In Example 2, in order to prevent a break defect at a crossing of the gate signal line 3 and the source signal line 5, the wiring protection layer 102 of silicon nitride is formed under the source signal line 5, so that the source signal line 5' has a two-layer structure. The break defect in the crossing is also prevented by providing a conductive layer between the gate signal line 3 and the source signal line 5.

Figure 6A:
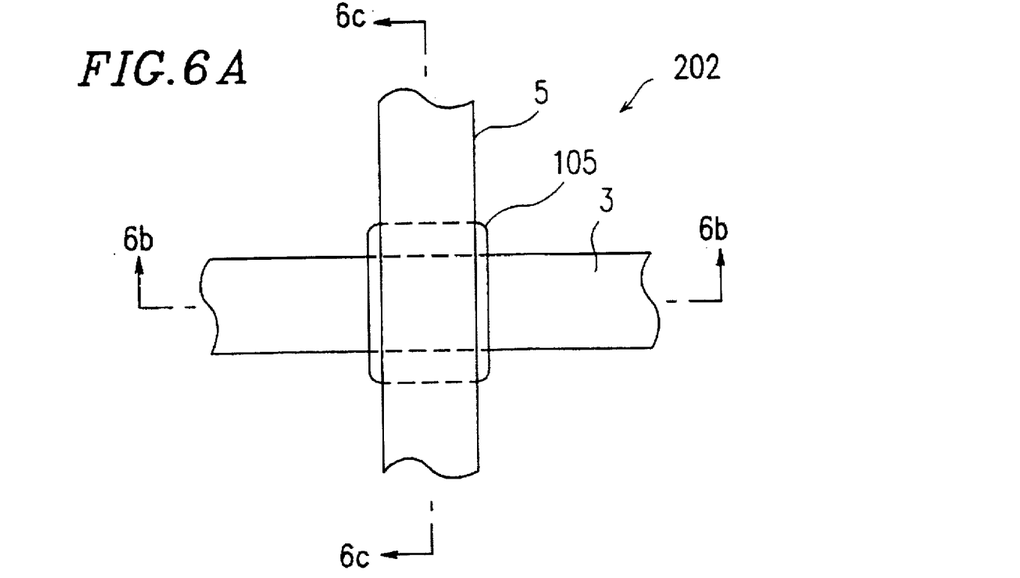
FIG. 6A is a plan view of a crossing of a gate signal line and a source signal line of an active matrix substrate according to still another embodiment of the present invention.
Figure 6B:
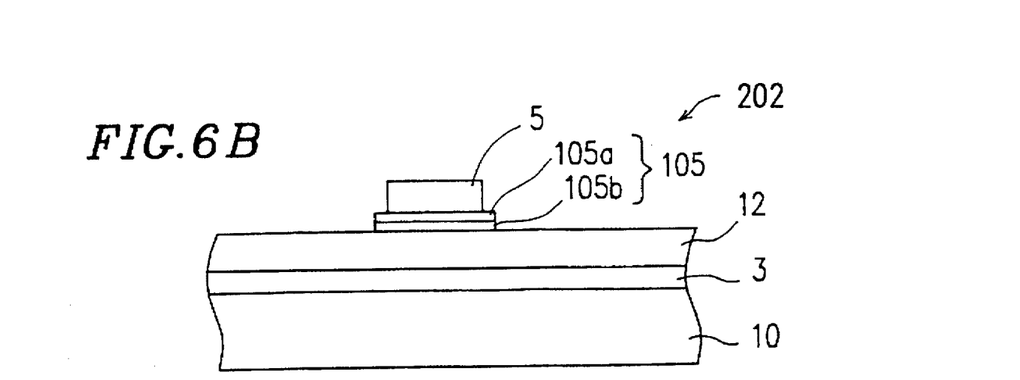
FIG. 6B is a cross-sectional view taken along line 6b—6b in FIG. 6A.
Figure 6C:
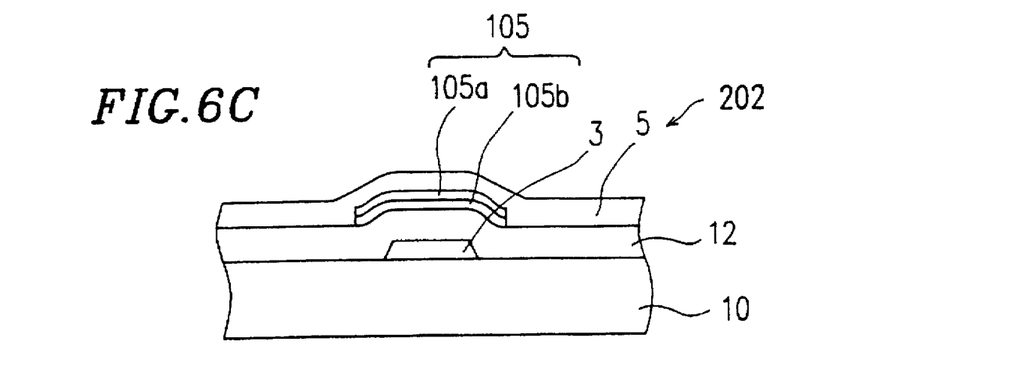
FIG. 6C is a cross-sectional view taken along line 6c—6c in FIG. 6A.

FIGS. 6A to 6C show a structure of an active matrix substrate 202 according to the third embodiment of the present invention. The overall structure of the active matrix substrate 202 and the structure of a switching element (TFT) portion thereof are the same as those of the active matrix substrate 200 of Example 1, as shown in FIGS. 1 and 4. FIG. 6A shows a crossing of the gate signal line 3 and the source signal line 5 on the active matrix substrate 202. FIGS. 6B and 6C are cross-sectional views taken along lines 5b—5b and 5c—5c in FIG. 6A, respectively.

In the active matrix substrate 202, a conductive layer 105 is formed so as to cover a step of an edge of the gate signal line 3 at the crossing as shown in FIG. 6A. The conductive layer 105 is formed in the same process step of patterning the source and drain electrodes 101a and 101b of the TFT 101. Accordingly, the conductive layer 105 is made of $n^+$ silicon and has the two-layer structure of an upper amorphous $n^+$ silicon layer 105a and a lower micro-crystalline $n^+$ silicon layer 105b, as shown in FIGS. 6B and 6C.

By forming the conductive layer 105 to have the two-layer structure, a break defect due to dust or foreign particulate stuck to the edge of the gate signal line 3 is prevented from occurring in the source signal line 5 at the crossing. Deterioration of the source signal line 5 due to a concave-convex surface of the under micro-crystalline layer is also prevented, realizing further effective prevention of the break defect.

EXAMPLE 4

Figure 7:
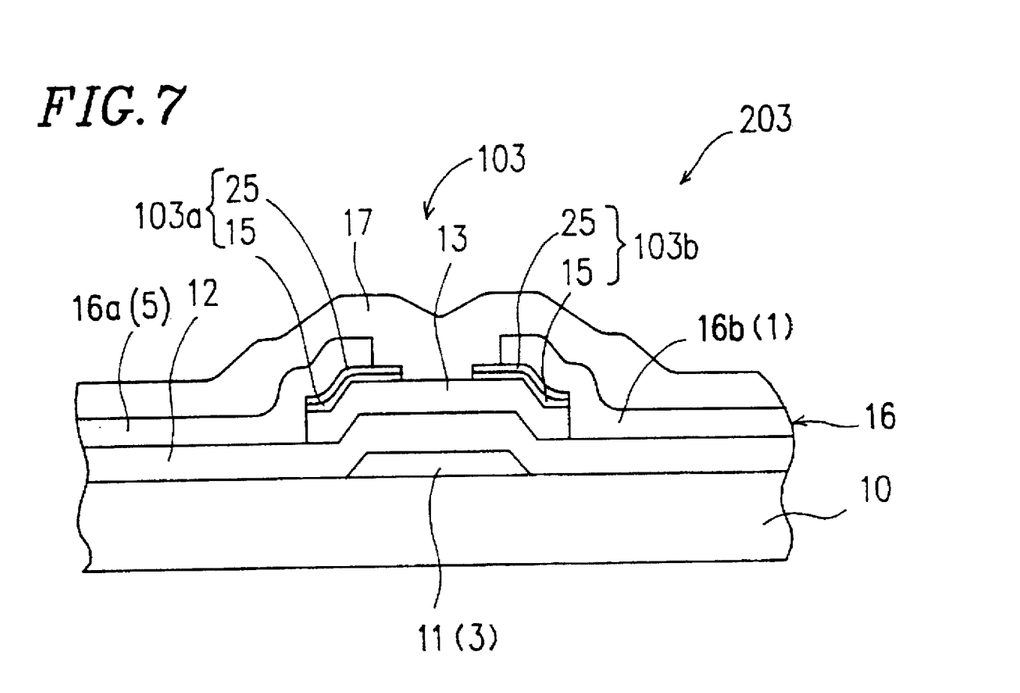
FIG. 7 is a cross-sectional view of a TFT portion of an active matrix substrate according to still another embodiment of the present invention.

FIG. 7 shows a cross-sectional structure of a portion in an active matrix substrate 203 according to the fourth embodiment of the present invention, in which a switching element 103 is formed. An overall structure of the active matrix substrate 203 is the same as that of the active matrix substrate 100 shown in FIG. 1.

As shown in FIG. 7, the switching element 103 of the active matrix substrate 203 is a TFT of a channel-etch type. The structure of the active matrix substrate 203 other than the type of the TFT is the same as that of the active matrix substrate 200 in the first example.

As shown in FIG. 7, the TFT 103 includes a gate electrode 11 formed on the insulation substrate 10, a gate insulating layer 12 covering the gate electrode 11, a semiconductor layer 13 formed on the gate insulating layer 12 opposite the gate electrode 11, a source electrode 103a formed on one end of the semiconductor layer 13, and a drain electrode 103b formed on the other end of the semiconductor layer 13.

The semiconductor layer 13 of the channel etch type TFT 103 has a thickness of about 200 nm which is thicker than that of the reverse stagger type TFT 101 (about 50 nm) of the first example. The semiconductor layer 13 is made of amorphous silicon or polycrystalline silicon. Each of the source electrode 103a and the drain electrode 103b includes a lower layer 15 made of micro-crystalline $n^+$ silicon and an upper layer 25 made of amorphous silicon, so as to have a two-layer structure.

A transparent conductive layer (ITO thin film) 16 is formed on the gate insulating layer 12, the source electrode 103a, and the drain electrode 103b. As shown in FIG. 7, the transparent conductive layer 16 includes portions 16a and 16b. As is in the case of the active matrix substrate 200 of the first example, the pixel electrode 1 and the source signal line 5 are formed by patterning the transparent conductive layer 16, the portion 16a forming the source signal line 5 and the portion 16b forming the pixel electrode 1. An insulating layer 17 is formed as a surface protection film on the insulation substrate 10 so as to cover the TFT 103. A central portion of the semiconductor layer 13 between the source electrode 103a and the drain electrode 103b of the TFT 103 is covered with the insulating layer 17.

Next, a method for fabricating the active matrix substrate 203 will be briefly described.

As is in the first example, a gate electrode 11 and a gate signal line 3 are formed on an insulation substrate 10 such as a glass or quartz substrate, by patterning a conductive layer of Ta or the like. Then, a silicon oxide film is formed on an entire surface of the insulation substrate 10 by using a CVD method, whereby a gate insulating layer 12 is formed. A semiconductor layer 13 is formed by patterning an amorphous silicon layer which is deposited on the gate insulating layer 12 using a CVD method so as to have a thickness of about 200 nm. The semiconductor layer 13 includes a channel region of the TFT 103.

A source electrode 103a and a drain electrode 103b are formed by using a two-step CVD method as described in the first example. First, a micro-crystalline $n^+$ silicon layer 15 having a thickness of 30 nm is formed on the semiconductor layer 13, and then an amorphous $n^+$ silicon layer 25 having a thickness of 20 nm is formed on the micro-crystalline $n^+$ silicon layer 15. Then, the micro-crystalline $n^+$ silicon layer 15 and the amorphous $n^+$ silicon layer 25 are patterned to form the source electrode 103a and the drain electrode 103b each having the two-layer structure. The fabrication of the TFT 103 is thus completed.

Next, a transparent conductive layer 16, for example, an ITO thin film is formed on the entire surface of the active matrix substrate 203 by sputtering. Then, the transparent conductive layer 16 is patterned to form a portion 16a for a source signal line 5 and a portion 16b for a pixel electrode 1. As shown in FIG. 7, the portion 16a (source signal line 5) overlaps the source electrode 103a, and the portion 16b (pixel electrode 1) overlaps the drain electrode 103b. Then, an insulating layer 17 is formed to cover the TFT 103 as a surface protection layer by using a CVD method.

According to this embodiment, the $n^+$ silicon layer forming the source and drain electrodes 103a and 103b which are disposed under the transparent conductive layer (ITO thin film) 16 has a relatively flat surface because of the two-layer structure of the upper amorphous layer 25 and the lower micro-crystalline layer 15. Therefore, large grains can grow in the transparent conductive layer 16 formed on the source and drain electrodes 103a and 103b, without being affected by the concave-convex surface of the lower micro-crystalline layer 15, so as to allow the characteristics (crystalline structure) of the ITO thin film to be satisfactory. This makes it possible to prevent a break defect from occurring in the source signal line 5 and the pixel electrode 1 formed on the source and drain electrodes 103a and 103b of the TFT 103, as well as in the active matrix substrate 200 in the first example.

Furthermore, the source and drain electrodes 103a and 103b have an electron mobility which is greater than that of source and drain electrodes of a single-layered amorphous silicon because of the micro-crystalline $n^+$ silicon layer 15 included therein. Thus, an ON-current of the TFT 103 can be increased, in addition to the prevention of the break defect in the ITO film due to the deterioration of the characteristics.

EXAMPLE 5

Figure 8A:
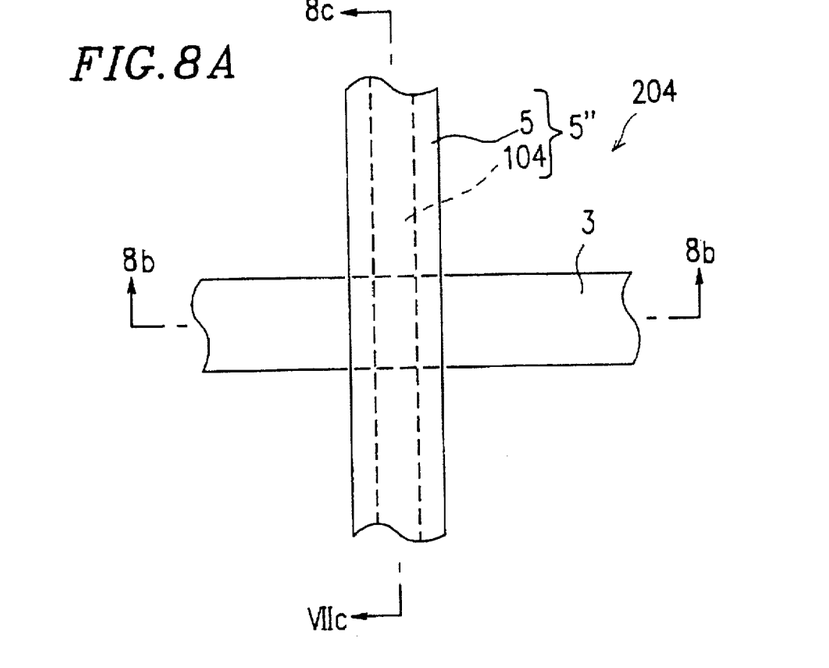
FIG. 8A is a plan view of a crossing of a gate signal line and a source signal line of an active matrix substrate according to still another embodiment of the present invention.
Figure 8B:
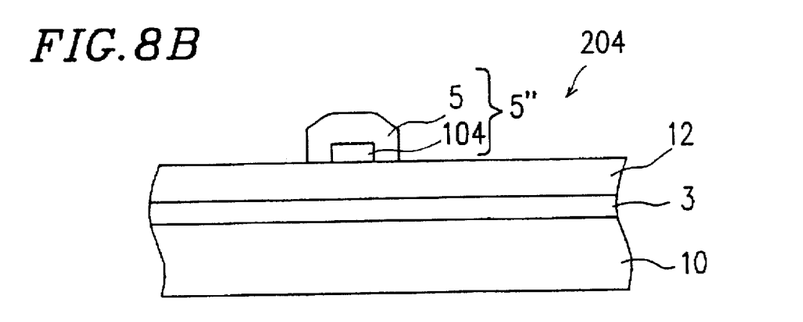
FIG. 8B is a cross-sectional view taken along line 8b—8b in FIG. 8A.
Figure 8C:
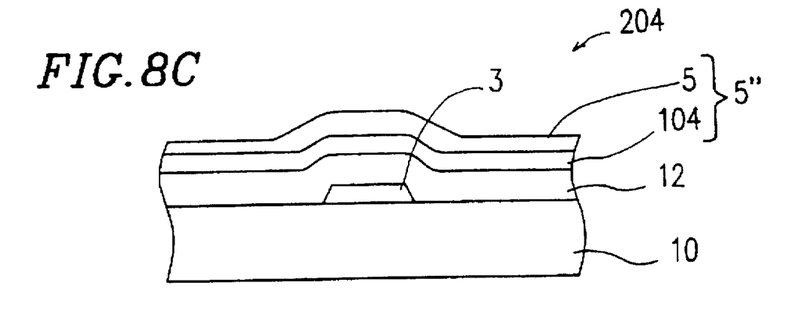
FIG. 8C is a cross-sectional view taken along line 8c—8c in FIG. 8A.

FIGS. 8A to 8C show a structure of an active matrix substrate 204 according to the fifth embodiment of the present invention. An overall structure of the active matrix substrate 204 and a structure of a switching element (TFT) portion thereof are the same as those of the active matrix substrate 203 of Example 4, as shown in FIGS. 1 and 7. FIG. 8A shows a crossing of a gate signal line 3 and a source signal line 5 on the active matrix substrate 204. FIGS. 8B and 8C are cross-sectional views taken along lines 8b—8b and 8c—8c in FIG. 8A, respectively.

As shown in FIGS. 8A to 8C, a wiring protection layer 104 is formed on the gate insulating layer 12 under the source signal line 5 in the active matrix substrate 204. In this example, a source signal line 5" is defined as including the source signal line 5 and the wiring protection layer 104. The wiring protection layer 104 is made of amorphous silicon, and may be formed in the same step involved in forming the semiconductor layer 13.

FIGS. 8A to 8C, the wiring protection layer 104 is illustrated as having a width narrower than that of the source signal line 5. Nevertheless, the width of the wiring protection layer 104 may be equal to or wider than that of the source signal line 5.

In the active matrix substrate 204 of this example, the wiring protection layer 104 is made of amorphous silicon, so that the transparent conductive film of the source signal line 5 formed on the wiring protection layer 104 is relatively dense and has a satisfactory crystalline structure. In addition, the gate insulating layer 12 and the wiring protection layer 104 are both interposed between the gate signal line 3 and the source signal line 5 at the crossing thereof. At the crossing, the gate insulating layer 12 is covered with the wiring protection layer 104. Thus, even if coverage of the gate insulating layer 12 is degraded at a step of an edge of the gate signal line 3 due to dust or other foreign particulate stuck to the edge, a break defect is prevented from occurring in the source signal line 5 by covering the degraded coverage of the gate insulating layer 12 with the wiring protection layer 104.

As described above, in the active matrix substrate 204 according to this example, a break defect is prevented from occurring in the source signal line 5 and the pixel electrode 1 which are formed on the source electrode 103a and the drain electrode 103b of the TFT 103, and from occurring at a crossing of the gate signal line 3 and the source signal line 5, resulting in a further increase of the fabrication yield.

EXAMPLE 6

Figure 9A:
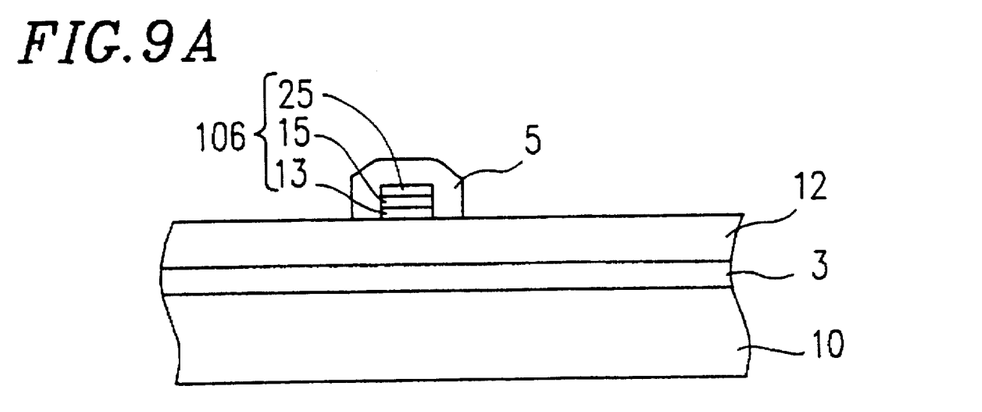
FIGS. 9A and 9B are cross-sectional views of a crossing of a gate signal line and a source signal line of an active matrix substrate according to still another embodiment of the present invention, taken along the gate signal line and the source signal line, respectively.
Figure 9B:
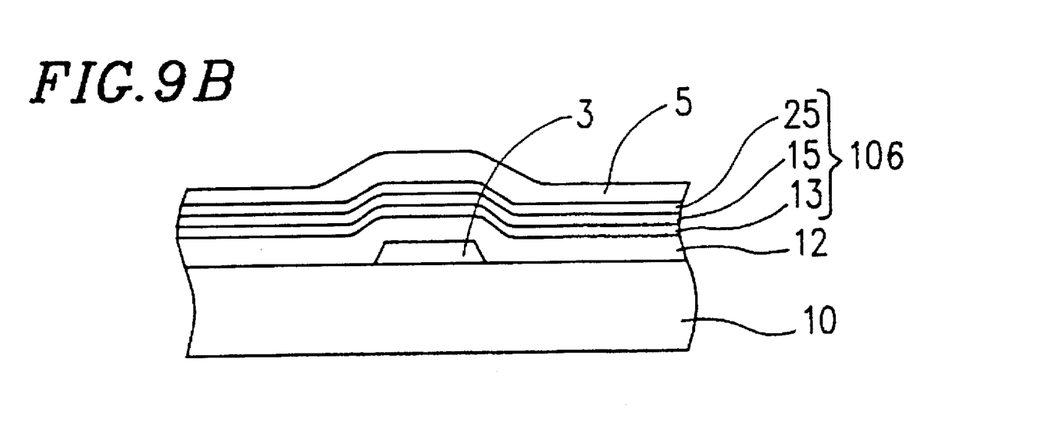

In Example 5, the wiring protection layer 104 is constituted from a single amorphous silicon layer, however, the present invention is not limited to this. As shown in FIGS. 9A and 9B, a wiring protection layer 106 may have a three-layer structure of a lower semiconductor layer 13, a middle micro-crystalline $n^+$ silicon layer 15, and an upper amorphous $n^+$ silicon layer 25. The three-layered wiring protection layer 106 prevents a break defect due to dust or other foreign particulate stuck to an edge of the gate signal line 3 from occurring in the source signal line 5 as well as the wiring protection layer 104 of the fifth example.

In FIGS. 9A and 9B, the wiring protection layer 106 is illustrated as having a width narrower than that of the source signal line 5. Nevertheless, the width of the wiring protection layer 106 may be equal to or wider than that of the source signal line 5.

Figure 10A:
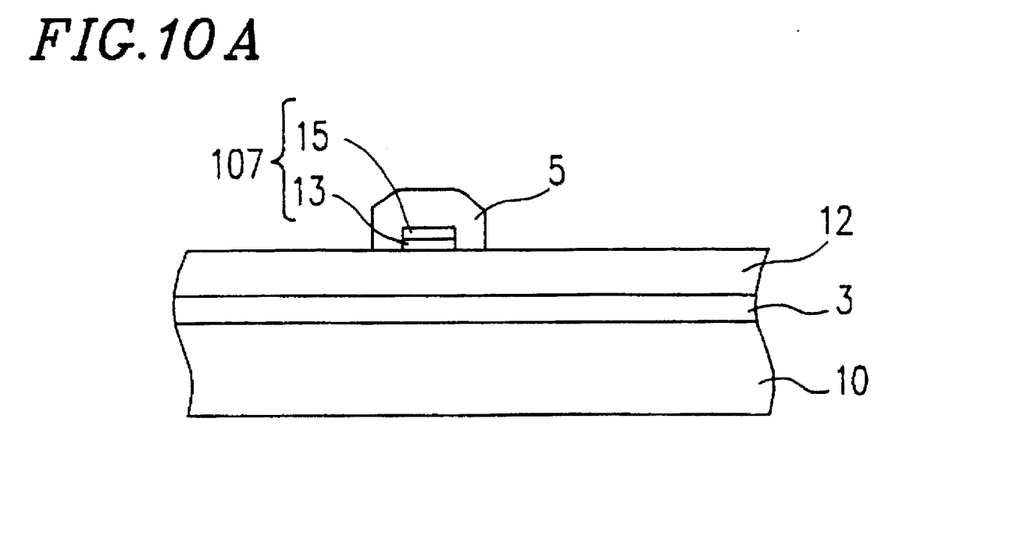
FIGS. 10A and 10B are cross-sectional views of a crossing of a gate signal line and a source signal line of an active matrix substrate according to still another embodiment of the present invention, taken along the gate signal line and the source signal line, respectively.
Figure 10B:
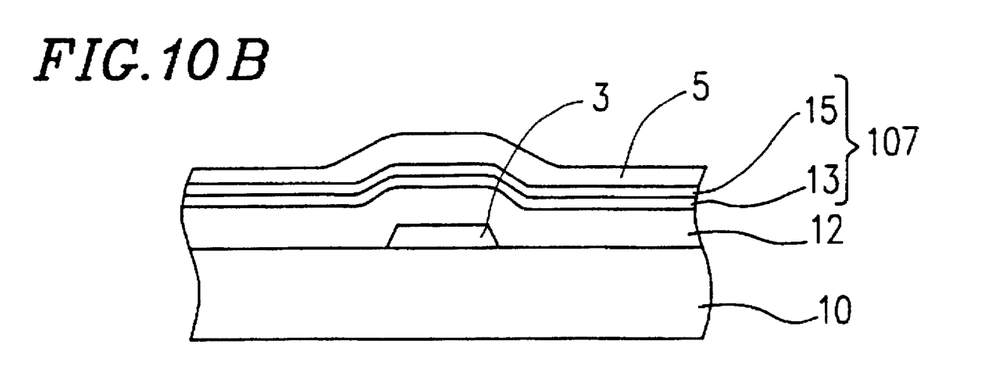

In addition, as shown in FIGS. 10A and 10B, a wiring protection layer 107 may have a two-layer structure of a lower semiconductor layer 13 and an upper micro-crystalline $n^+$ silicon layer 15. The two-layered wiring protection layer 107 prevents a break defect due to dust or other foreign particulate stuck to an edge of the gate signal line 3 from occurring in the source signal line 5.

In this case, the width of the wiring protection layer 107 is preferably narrower than that of the source signal line 5 as shown in FIG. 10A. The transparent conductive film of the source signal line 5 which is formed on the micro-crystalline $n^+$ silicon layer 15 is not satisfactorily dense and is subject to being degraded due to a concave-convex surface of the micro-crystalline $n^+$ silicon layer 15. Thus, when the transparent conductive film is formed only on the micro-crystalline $n^+$ silicon layer 15, the degradation of the transparent conductive film leads to a break defect of the source signal line 5. By making the width of the source signal line 5 wider than that of the micro-crystalline $n^+$ silicon layer 15 so that the source signal line 5 has a non-degraded portion on the both sides thereof, break defects due to the degradation of the transparent conductive film can be prevented.

In this example, the $n^+$ silicon layer 105 having a two-layer structure of an upper amorphous $n^+$ silicon layer 105a and a lower micro-crystalline $n^+$ silicon layer 105b as described above in the third example referring to FIGS. 6A to 6C may also be used to cover the edge of the gate signal line 3 in order to prevent a break defect at a crossing.

In addition, a wiring protection layer 106 or 107 and an $n^+$ silicon layer 105 having a two-layer structure may be both used in this example.

As described above, according to the present invention, source and drain electrodes of a switching element (TFT) of an active matrix substrate are made of an $n^+$ silicon layer which has a two-layer structure including an upper amorphous $n^+$ silicon layer and a lower micro-crystalline $n^+$ silicon layer. This makes it possible to increase an ON-current of the TFT by the lower micro-crystalline layer and to prevent a deterioration of a transparent conductive layer (ITO thin film of a source signal line and a pixel electrode) formed on the source and drain electrodes by the upper amorphous layer so as to prevent a break defect of the source signal line and the pixel electrode due to at a step of an edge of the gate electrode.

The present invention is applicable to switching elements including reverse stagger type TFTs, channel etch type TFTs, and the like, and to an active matrix substrate using such a switching element.

In the active matrix substrate of the present invention, a source signal line has a two-layer structure in which a wiring protection layer is provided under a conductive layer (usually referred to as a source signal line). Therefore, a gate insulating layer and the wiring protection layer are interposed between the gate signal line and the source signal line (conductive layer) at a crossing thereof. Thus, even if coverage of the gate insulating layer is degraded at a step of an edge of the gate signal line due to dust or other foreign particulate stuck to the edge, a break defect is prevented from occurring in the source signal line by covering the degraded coverage of the gate insulating layer with the wiring protection layer.

In the case where an insulating layer such as a silicon nitride layer is used as the wiring protection layer which is formed under the conductive layer in the two-layered source signal line, the characteristics of the conductive layer are not degraded. Therefore, the conductive layer of the source signal line can be formed as a single layer made of ITO. This makes it possible to simplify the fabrication process by patterning the conductive layer of the source signal line and the pixel electrode from the same ITO film.

In the case where the wiring protection layer is a single amorphous semiconductor layer such as an amorphous silicon layer, or in the case where the wiring protection layer has a three-layer structure of a lower amorphous silicon layer, a middle micro-crystalline silicon layer, and an upper amorphous silicon layer, the characteristics of the conductive layer of the two-layered source signal line are not degraded. Therefore, the conductive layer of the source signal line can be formed as a single layer made of ITO. Thus, the conductive layer of the source signal line and the pixel electrode can be patterned from the same ITO film. In addition, the wiring protection layer can be formed in the same step of forming the source and drain electrodes of the TFT, requiring no additional step for forming, the wiring protection layer. This makes it possible to simplify the fabrication process of the active matrix substrate.

In the case where the wiring protection layer has a two-layer structure of a lower amorphous silicon layer and an upper micro-crystalline silicon layer, the degradation of characteristics of the conductive layer (source signal line) is subject to occurring due to a concave-convex surface of the micro-crystalline silicon layer. However, the degradation of the conductive layer can be compensated by forming the width of the wiring protection layer narrower than that of the conductive layer of the two-layered source signal line, whereby a break defect in the source signal line can be prevented.

In general, the source signal line has many crossings over other wirings or lines such as the gate signal lines, being subjected to more a break defect as compared with the pixel electrode. Therefore, when the source signal line is formed of a conductive layer such as an ITO thin film which is usually used for the pixel electrode and is easily affected by a surface condition of the underlying layer of such as source and drain electrodes, a break defect of the source signal line occurs quite easily. According to the present invention, the conductive layer such as an ITO thin film can be formed on the underlying layer without degradation in the characteristics, so that the break defect of the source signal line is effectively prevented. Therefore, even when the source signal line is patterned from the same ITO thin film of the pixel electrode, the break defect of the source signal line can be reduced. This results in the significant advantages of simplifying the fabrication process and increasing the fabrication yield.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An active matrix substrate comprising:

an insulation substrate;

a plurality of pixel electrodes arranged in a matrix form on the insulation substrate;

a switching element provided for each of the pixel electrodes;

gate signal lines for supplying to the switching elements a signal for controlling an electrically conducting state and a non-conducting state of the switching elements; and source signal lines for supplying a data signal to the pixel electrodes via the corresponding switching elements;

wherein each switching element is a thin film transistor (TFT) including:

a gate electrode formed on the insulation substrate;

an insulating layer formed on the insulation substrate so as to cover the gate electrode;

a semiconductor layer formed on the insulating layer in a portion opposite to one of the gate electrodes, the semiconductor layer including a channel region;

a source electrode formed on one end of the semiconductor layer, one of the source signal lines overlapping the source electrode; and a drain electrode formed on the other end of the semiconductor layer, one of the pixel electrodes overlapping the drain electrode, and wherein the source and drain electrodes have a two-layer structure of an upper amorphous semiconductor layer and a lower micro-crystalline semiconductor layer.

2. An active matrix substrate according to claim 1, wherein the source and drain electrodes are made of an n-type silicon and have a two-layer structure of an upper amorphous n-type silicon layer and a lower micro-crystalline n-type silicon layer.

3. An active matrix substrate according to claim 1, wherein the TFT is of a channel etch type.

4. An active matrix substrate according to claim 1, wherein the TFT further includes a second insulating layer formed on the channel region of the semiconductor layer so as to protect the channel region, the TFT being of a reverse stagger type.

5. An active matrix substrate according to claim 1, wherein each of the source signal lines has a two-layer structure of an upper conductive layer and a lower protection layer made of an insulator.

6. An active matrix substrate according to claim 4, wherein each of the source signal lines has a two-layer structure of an upper conductive layer and a lower protection layer which is patterned from a same insulating layer as the second insulating layer.

7. An active matrix substrate according to claim 1, wherein each of the source signal lines has a two-layer structure of an upper conductive layer and a lower protection layer made of a semiconductor.

8. An active matrix substrate according to claim 7, wherein the lower protection layer is patterned from a same layer as the semiconductor layer formed on the insulating layer on the gate electrode.

9. An active matrix substrate according to claim 7, wherein the lower protection layer is an amorphous semiconductor layer.

10. An active matrix substrate according to claim 7, wherein the lower protection layer has a two-layer structure of an upper micro-crystalline semiconductor layer and a lower amorphous semiconductor layer.

11. An active matrix substrate according to claim 7, wherein the lower protection layer has a three-layer structure of an upper amorphous semiconductor layer, a middle micro-crystalline semiconductor layer, and a lower amorphous semiconductor layer.

12. An active matrix substrate according to claim 10, wherein the lower amorphous semiconductor layer of the lower protection layer is patterned from a same semiconductor layer as the semiconductor layer formed on the insulating layer on the gate electrode, and the upper micro-crystalline semiconductor layer of the lower protection layer is patterned from a same micro-crystalline semiconductor layer as the lower micro-crystalline layer of the source and drain electrodes.

13. An active matrix substrate according to claim 11, wherein the lower amorphous semiconductor layer of the lower protection layer is patterned from a same semiconductor layer as the semiconductor layer formed on the insulating layer on the gate electrode, the middle micro-crystalline semiconductor layer of the lower protection layer is patterned from a same micro-crystalline semiconductor layer as the lower micro-crystalline layer of the source and drain electrodes, and the upper amorphous semiconductor layer of the lower protection layer is patterned from a same amorphous semiconductor layer as the upper amorphous semiconductor layer of the source and drain electrodes.

14. An active matrix substrate according to claim 1, wherein the source signal lines and the pixel electrodes are patterned from a same conductive thin film.

15. An active matrix substrate according to claim 1, wherein each of the source signal lines has an upper conductive layer and a lower protection layer which is provided at crossings of the source signal lines over the gate signal lines.

16. An active matrix substrate according to claim 15, wherein the lower protection layer is made of an amorphous semiconductor.

17. An active matrix substrate according to claim 15, wherein the lower protection layer has a two-layer structure of an upper micro-crystalline semiconductor layer and a lower amorphous semiconductor layer.

18. An active matrix substrate according to claim 15, wherein the lower protection layer has a three-layer structure of an upper amorphous semiconductor layer, a middle micro-crystalline semiconductor layer, and a lower amorphous semiconductor layer.

19. A thin film transistor (TFT) used as a switching element for an active matrix substrate, comprising:

a gate electrode formed on an insulation substrate;

an insulating layer formed on the gate electrode;

a semiconductor layer formed on the insulating layer including a channel region;

a source electrode formed on one end of the semiconductor layer, a first conductive layer overlapping the source electrode; and a drain electrode formed on the other end of the semiconductor layer, a second conductive layer overlapping the drain electrode, wherein the source and drain electrodes have a two-layer structure of an upper amorphous semiconductor layer and a lower micro-crystalline semiconductor layer.

20. A TFT according to claim 19, wherein the source and drain electrodes are made of an n-type silicon and have a two-layer structure of an upper amorphous n-type silicon layer and a lower micro-crystalline n-type silicon layer.

* * * * *